(12) United States Patent
Chen et al.

(10) Patent No.: US 10,361,233 B2
(45) Date of Patent: Jul. 23, 2019

(54) HIGH-K DIELECTRIC LINERS IN SHALLOW TRENCH ISOLATIONS

(71) Applicant: Taiwan Semiconductor Manufacturing Company, Ltd., Hsin-Chu (TW)

(72) Inventors: Szu-Ying Chen, Toufen Township (TW); Tzu-Jui Wang, Fengshan (TW); Jen-Cheng Liu, Hsin-Chu (TW); Dun-Nian Yaung, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/130,489

(22) Filed: Apr. 15, 2016

(65) Prior Publication Data
US 2016/0233256 A1 Aug. 11, 2016

Related U.S. Application Data

(62) Division of application No. 13/198,018, filed on Aug. 4, 2011, now Pat. No. 9,318,370.

(51) Int. Cl.
*H01L 27/146* (2006.01)
*H01L 21/762* (2006.01)

(52) U.S. Cl.
CPC .... *H01L 27/1463* (2013.01); *H01L 21/76232* (2013.01); *H01L 27/14643* (2013.01); *H01L 27/14689* (2013.01)

(58) Field of Classification Search
CPC ........... H01L 27/1463; H01L 21/76232; H01L 27/14643; H01L 27/14689

USPC ........................................................ 257/431
See application file for complete search history.

(56) References Cited

U.S. PATENT DOCUMENTS

| | | | |
|---|---|---|---|
| 4,097,314 A * | 6/1978 | Schlesier | H01L 21/02178 148/DIG. 3 |
| 5,384,280 A * | 1/1995 | Aoki | H01L 21/76 148/DIG. 15 |
| 5,811,347 A * | 9/1998 | Gardner | H01L 21/3144 148/DIG. 50 |
| 6,046,487 A | 4/2000 | Benedict et al. | |
| 6,211,509 B1 | 4/2001 | Inoue et al. | |
| 6,265,302 B1 | 7/2001 | Lim et al. | |
| 6,329,266 B1 * | 12/2001 | Hwang | H01L 21/76224 257/E21.546 |
| 6,380,104 B1 | 4/2002 | Yu | |
| 6,569,700 B2 | 5/2003 | Yang | |
| 6,727,569 B1 * | 4/2004 | Gardner | H01L 21/76235 257/506 |
| 6,844,612 B1 | 1/2005 | Tian et al. | |

(Continued)

FOREIGN PATENT DOCUMENTS

| CN | 1511349 A | 7/2004 |
|---|---|---|
| CN | 101312191 A | 11/2008 |

*Primary Examiner* — Ori Nadav
(74) *Attorney, Agent, or Firm* — Slater Matsil, LLP

(57) ABSTRACT

A circuit structure includes a semiconductor substrate having a top surface. A dielectric material extends from the top surface into the semiconductor substrate. A high-k dielectric layer is formed of a high-k dielectric material, wherein the high-k dielectric layer comprises a first portion on a sidewall of the dielectric material, and a second portion underlying the dielectric material.

20 Claims, 4 Drawing Sheets

(56) References Cited

U.S. PATENT DOCUMENTS

| | | | |
|---|---|---|---|
| 6,974,755 B2 * | 12/2005 | Ko | H01L 21/28123 |
| | | | 257/E21.206 |
| 7,396,728 B2 * | 7/2008 | Varghese | H01L 21/76224 |
| | | | 257/E21.546 |
| 7,422,924 B2 | 9/2008 | Rhodes | |
| 7,504,704 B2 | 3/2009 | Currie et al. | |
| 7,859,075 B2 | 12/2010 | Jung | |
| 7,902,628 B2 * | 3/2011 | Lim | H01L 21/76229 |
| | | | 257/506 |
| 7,919,797 B2 | 4/2011 | Rhodes et al. | |
| 8,482,042 B2 * | 7/2013 | Lindsay | H01L 21/26506 |
| | | | 257/288 |
| 8,501,632 B2 * | 8/2013 | Stapelmann | H01L 21/3105 |
| | | | 257/E21.549 |
| 8,569,146 B2 * | 10/2013 | Ko | H01L 21/76224 |
| | | | 438/424 |
| 8,580,595 B2 | 11/2013 | Shinohara et al. | |
| 8,592,874 B2 | 11/2013 | Mori et al. | |
| 8,686,529 B2 * | 4/2014 | Bui | H01L 31/035281 |
| | | | 257/461 |
| 8,987,834 B2 * | 3/2015 | Grisham | H01L 21/823431 |
| | | | 257/401 |
| 9,653,543 B2 * | 5/2017 | Tilke | H01L 29/0649 |
| 2002/0171097 A1 | 11/2002 | Chen et al. | |
| 2004/0084701 A1 * | 5/2004 | Kanaya | H01L 27/11502 |
| | | | 257/295 |
| 2005/0073022 A1 | 4/2005 | Karlsson et al. | |
| 2005/0151218 A1 | 7/2005 | Mouli | |
| 2005/0156274 A1 * | 7/2005 | Yeo | H01L 21/76229 |
| | | | 257/510 |
| 2007/0138552 A1 | 6/2007 | Chang et al. | |
| 2007/0161206 A1 * | 7/2007 | Ko | H01L 21/76224 |
| | | | 438/424 |

\* cited by examiner

HIGH-K DIELECTRIC LINERS IN SHALLOW TRENCH ISOLATIONS

This application is a divisional of Ser. No. 13/198,018, filed on Aug. 4, 2011, entitled "High-k Dielectric Liners in Shallow Trench Isolations," which application is incorporated by reference herein.

BACKGROUND

Shallow trench isolation (STI) regions are formed in integrated circuits to isolate devices. In the formation process of conventional STI regions, openings are first formed in semiconductor substrates. Silicon oxide liners are formed in the openings, followed by a gap filling process, wherein the remaining portions of the openings are filled with a dielectric material. A chemical mechanical polish (CMP) is then performed to remove excess portions of the dielectric material. The portions of the dielectric material and the silicon oxide liner that are left in the openings thus form the STI regions.

High-density plasma (HDP) chemical vapor deposition (CVD) was typically used for the gap-filling in the formation of the STI regions. In recent years, high-aspect ratio process (HARP) was sometimes used to replace the HDP for the gap filling process. The STI regions formed using the HARP is not as dense as the STI regions formed using the HDP. To prevent the STI regions formed using the HARP from being etched excessively in subsequent wet etching processes, the respective wafer is annealed at a high temperature for a long time to condense the STI regions.

The anneal in the STI formation incurs problems for the formation of complementary metal-oxide-semiconductor (CMOS) image sensor (CIS) chips. The CIS chips have a strict requirement to the leakage of devices. Accordingly, in the STI formation processes that adopt HARP, after the formation of the silicon oxide liners (which are formed using in-situ steam generation (ISSG)) in the STI openings, a field implantation is performed to implant a p-type impurity into the STI openings. The p-type impurity forms P+ regions in the respective substrate regions that adjacent the STI regions. The P+ regions adjoin the silicon oxide liners. The P+ regions may help reduce the leakage of the respective image sensors such as photo diodes.
In subsequent steps, the gap filling is performed, and the STI openings are filled with a dielectric material. An anneal is then performed to condense the dielectric material. The anneal causes the p-type impurity to diffuse away from the implanted regions, and hence the leakage-prevention ability of the P+ regions is adversely affected. Furthermore, the diffusion of the p-type impurity may cause the adjacent n-wells to shrink.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A shallow trench isolation (STI) region and the method of forming the same are provided in accordance with embodiments. The intermediate stages of manufacturing various embodiments are illustrated. The variations of the embodiments are discussed. Throughout the various views and illustrative embodiments, like reference numbers are used to designate like elements.

Figure 1:
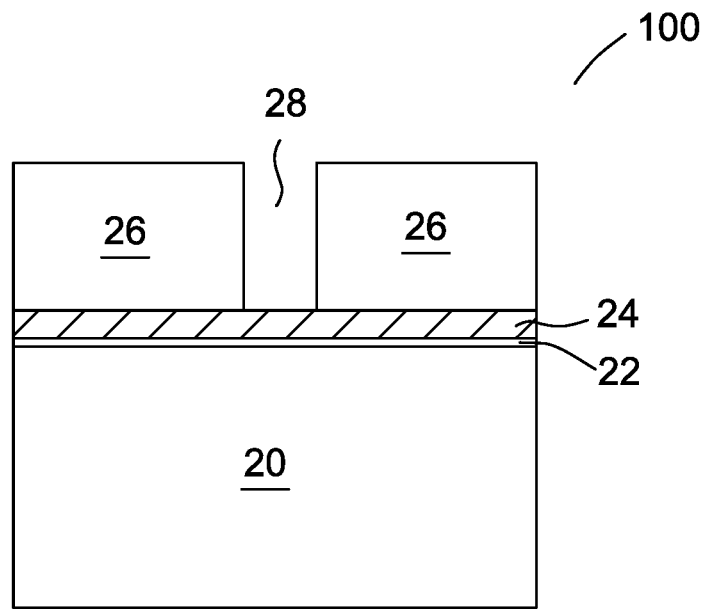
FIGS. 1 through 6 are cross-sectional views of intermediate stages in the manufacturing of a shallow trench isolation (STI) region in accordance with various embodiments.

Referring to FIG. 1, semiconductor substrate 20 is provided. Semiconductor substrate 20 may be in wafer 100, which may be an image sensor wafer, on which image sensors are to be formed. In an embodiment, semiconductor substrate 20 is a silicon substrate formed of silicon, although other commonly used materials such as carbon, germanium, gallium, arsenic, nitrogen, indium, phosphorus, and/or the like, may also be included in semiconductor substrate 20. Semiconductor substrate 20 may be formed of a single-crystalline semiconductor material or compound semiconductor materials, and may be a bulk substrate or a semiconductor-on-insulator (SOI) substrate.

Pad layer 22 (which is optional) and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24, and may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography process. Photoresist 26 is formed on mask layer 24 and is then patterned, forming opening 28 in photoresist 26.

Figure 2:
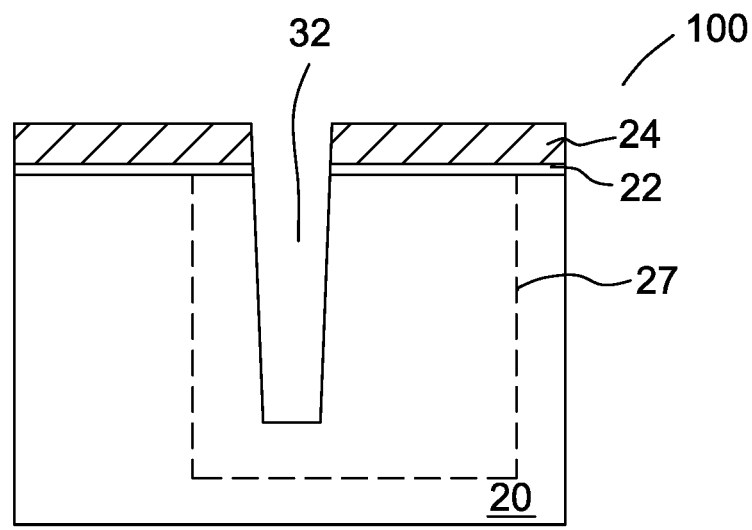

Referring to FIG. 2, mask layer 24 and pad layer 22 are etched through opening 28, exposing underlying semiconductor substrate 20. The exposed semiconductor substrate 20 is then etched, forming trench 32. Photoresist 26 is then removed. In an embodiment, trench 32 is formed in, and contacting, semiconductor substrate 20, which is of p-type. In alternative embodiments, trench 32 is formed in p-well 27 in substrate 20. In these embodiments, p-well 27 is a doped region of substrate 20, and may be doped with boron, indium, or the like.

Figure 3:
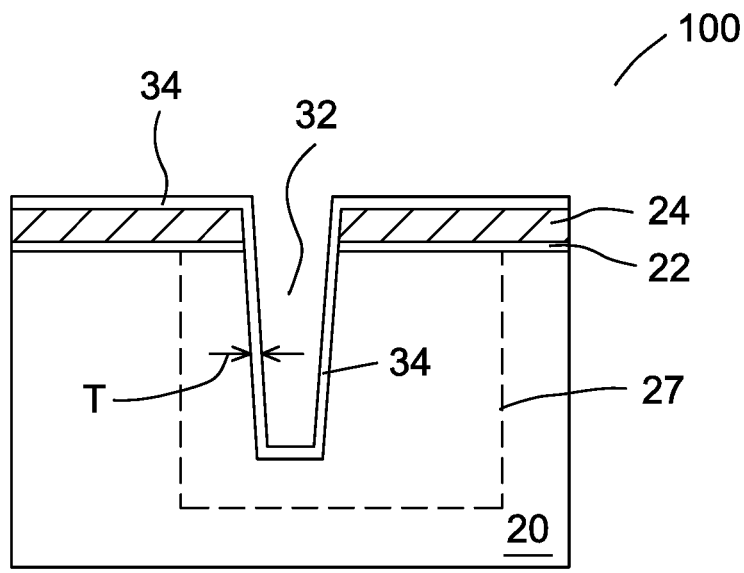

High-k dielectric layer 34 is then formed in trench 32, as is shown in FIG. 3. High-k dielectric layer 34 is formed of a high-k dielectric material having a k value higher than 3.9, or higher than 8.0. In an embodiment, high-k dielectric layer 34 is formed using a deposition technique that can form conformal dielectric layers, such as atomic layer deposition (ALD), although other applicable methods such as selective area chemical vapor deposition (SACVD) may also be used. Thickness T of high-k dielectric layer 34 may be between about 40 Å and about 100 Å. One skilled in the art, however, will realize that the dimensions recited throughout the descriptions are merely examples, and may be changed to suit different scales of integrated circuits. High-k dielectric layer 34 may be a substantially conformal layer whose vertical portions and the horizontal portion (at the bottom of trench 32) have substantially the same thickness, for example, with a difference less than about 20 percent of the thicknesses of the vertical portions and the horizontal portions. The materials of high-k dielectric layer 34 may be selected from, but are not limited to, $HfO_2$, HFSiOx, HFSiON, $ZrO_2$, $La_2O_3$, and combinations thereof. High-k dielectric layer 34 may have a high density of traps for electrons. In an embodiment, high-k dielectric layer 34 is formed of a single layer. In alternative embodiments, high-k dielectric layer 34 comprises a plurality of layers stacked, with the plurality of layers formed of different materials.

An anneal is then performed. The anneal results in an improvement in the thermal stability of high-k dielectric layer 34 and the thermal stability of the interface between high-k dielectric layer 34 and semiconductor substrate 20. The temperature of the anneal may be between about 500° C. and about 1000° C., and the duration of the anneal may be between about 5 minutes and about 60 minutes.

Figure 4:
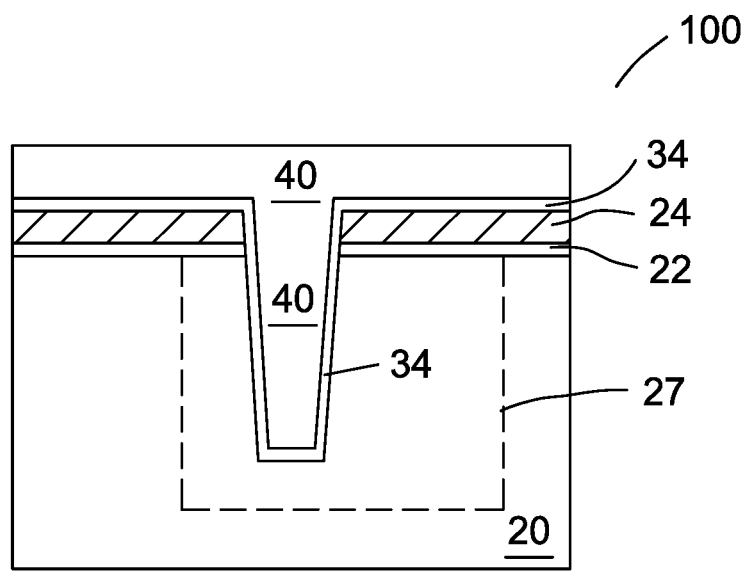

Referring to FIG. 4, the remaining portion of trench 32 is filled by dielectric material 40, until the top surface of dielectric material 40 is higher than the top surface of mask layer 24. Dielectric material 40 is referred to as oxide 40 hereinafter, even though it may comprise materials other than oxides, such as SiON, SiN, or the like. The filling of trench 32 may be performed using a method less prone to voids. In an embodiment, oxide 40 is formed using high aspect ratio process (HARP). Ozone ($O_3$) and tetraethyl orthosilicate (TEOS) may be used as process gases. As a result, oxide 40 may include the TEOS oxide, which is also silicon oxide. The HARP has the ability of filling openings with high aspect ratios, and trench 32 may be filled with substantially no voids formed therein. Alternatively, other deposition methods, such as SACVD or atmospheric pressure chemical vapor deposition (APCVD), may be used, wherein the TEOS and oxygen may be used as the process gases. In an embodiment, during a period starting from a time before high-k dielectric layer 34 is formed ending at a time trench 32 is filled with oxide 40, no implantation of p-type impurities is performed to high-k dielectric layer 34 and the underlying semiconductor substrate 20.

After the formation of oxide region 40, an anneal may be performed to the structure shown in FIG. 4. The anneal results in an improvement in the property of oxide region 40 and the resulting dielectric region 42 (not shown in FIG. 4, please refer to FIG. 5), and results in a densification of dielectric region 42. The anneal may be a steam anneal, in which water steam is used. In an exemplary embodiment, the temperature of the anneal may be between about 800° C. and about 1,200° C., and the duration of the anneal may be between about 30 minutes and about 200 minutes. In alternative embodiments, a dry anneal is performed. In the dry anneal, no steam is introduced.

Figure 5:
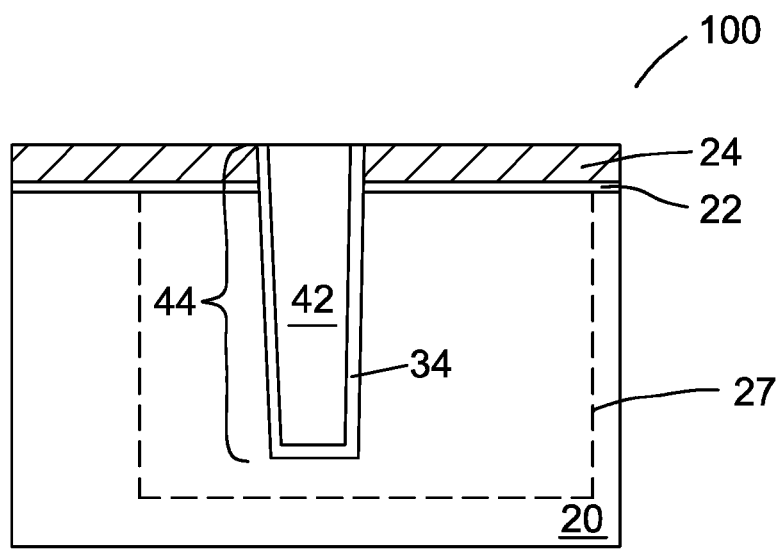

Referring to FIG. 5, a planarization, which may be a chemical mechanical polish (CMP), is performed to remove excess portions of dielectric material 40 and high-k dielectric layer 34 that are over mask layer 24. Mask layer 24 may act as a CMP stop layer during the CMP. The remaining portion of oxide 40 is denoted as dielectric region 42. Throughout the description, high-k dielectric layer 34 and dielectric region 42 in combination are referred to as STI region 44.

Figure 6:
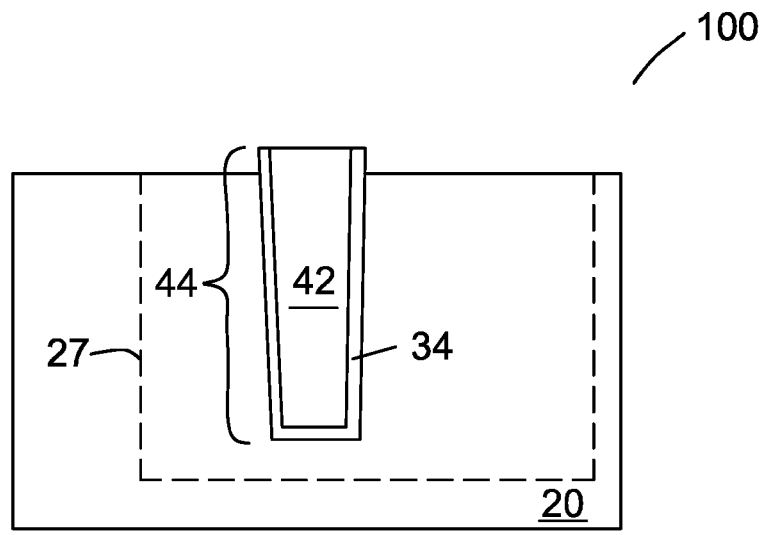

Mask layer 24 and pad layer 22 are then removed, as shown in FIG. 6. Mask layer 24, if formed of silicon nitride, may be removed by a wet clean process using hot solution of $H_3PO_4$, while pad layer 22 may be removed using diluted HF if formed of silicon oxide. It is noted that dielectric region 42 has been densified, and hence the removal of pad layer 22 will not cause a significant portion of dielectric region 42 to be removed.

In the resulting structure as shown in FIG. 6, high-k dielectric layer 34 is in physical contact with the semiconductor material, which may be in p-well 27 or p-type substrate 20. High-k dielectric layer 34 fully separates the semiconductor material of p-well 27 or p-type substrate 20 from dielectric region 42.

Figure 7:
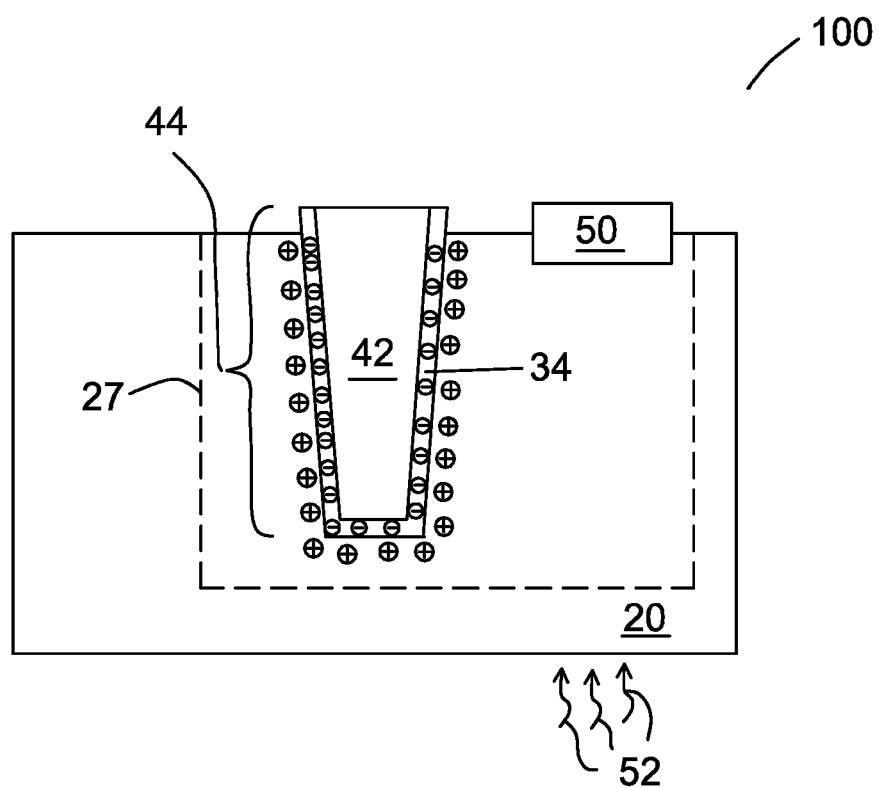
FIG. 7 schematically illustrates an image sensor formed at a surface of a substrate, in which the STI region is formed.

FIG. 7 illustrates the formation of image sensor 50. In an embodiment, image sensor 50 comprises a photo diode. In alternative embodiments, image sensor 50 comprises a photo sensitive transistor. Image sensor 50 is configured to receive light (symbolized by the curved arrows 52), and convert the light to an electrical signal. Wafer 100 and the respective chip may thus be a complementary metal-oxide-semiconductor (CMOS) image sensor (CIS) wafer and a CIS chip, respectively.

By forming high-k dielectric layer 34, the high-k material of high-k dielectric layer 34 traps negative charges in the high-k material. Accordingly, positive charges accumulate at the interface region of substrate 20 (or p-well 27), wherein the interface region is adjacent to the interface between high-k dielectric layer 34 and substrate 20 (or p-well 27). This results in a P+ layer formed at the interface, which may help reduce the leakage. Accordingly, there is no need to implant a P+ layer at the interface region. The adverse effect caused by the implantation of the P+ layer is thus eliminated.

In accordance with embodiments, a circuit structure includes a semiconductor substrate having a top surface. A dielectric material extends from the top surface into the semiconductor substrate. A high-k dielectric layer is formed of a high-k dielectric material, wherein the high-k dielectric layer includes a first portion on a sidewall of the dielectric material, and a second portion underlying the dielectric material.

In accordance with other embodiments, a circuit structure includes a semiconductor substrate having a top surface. An opening extends from the top surface into a p-type region of the semiconductor substrate. A dielectric material fills the opening. A high-k dielectric layer is disposed between the dielectric material and the semiconductor substrate, wherein the high-k dielectric layer is in physical contact with the semiconductor substrate. A photo image sensor is disposed at the top surface of the semiconductor substrate, wherein the photo image sensor is configured to receive light, and convert the light to an electrical signal.

In accordance with yet other embodiments, a method includes etching a semiconductor substrate to form an opening extending from a top surface of the semiconductor substrate into the semiconductor substrate. A high-k dielectric layer is deposited on sidewalls and a bottom of the opening, wherein the high-k dielectric layer is formed of a high-k dielectric material. A dielectric material is filled into the opening and on the high-k dielectric layer. A planarization is then performed to remove excess portions of the dielectric material over the top surface of the semiconductor substrate.

In accordance with an embodiment, a method includes forming a patterned mask layer over a semiconductor substrate and using the patterned mask layer to etch the semiconductor substrate and form an opening extending from a top surface of the semiconductor substrate into the semiconductor substrate. The method further includes depositing a high-k dielectric layer on sidewalls and a bottom of the opening. The high-k dielectric layer includes a high-k dielectric material. The method further includes filling a dielectric material into the opening and on the high-k dielectric layer, performing a planarization to remove excess portions of the dielectric material over the top surface of the patterned mask layer, and removing the patterned mask layer to expose a sidewall of the high-k dielectric layer.

In accordance with an embodiment, a method includes depositing a mask layer over a semiconductor substrate, patterning an opening through the mask layer to expose a top surface of the semiconductor substrate, and extending the opening into the semiconductor substrate. The method further includes depositing a high-k dielectric layer over the mask layer and along sidewalls and a bottom surface of the opening. The high-k dielectric layer includes a k-value greater than 8.0. The method further includes performing a first anneal on the high-k dielectric layer and after performing the first anneal, filling remaining portions of the opening with a dielectric material. The method further includes removing excess portions of the high-k dielectric layer and the dielectric material over the mask layer.

In accordance with an embodiment, a method includes patterning an opening into a p-well region of a semiconductor substrate using a mask layer as a patterning mas and depositing a high-k dielectric liner on sidewalls and a bottom surface of the opening. The high-k dielectric liner forms an interface with the p-well region, and the high-k dielectric liner has a k-value greater than 8.0. The method further includes performing a first anneal on the high-k dielectric liner, after performing the first anneal, filling remaining portions of the opening with a dielectric material, and planarizing the high-k dielectric liner and the dielectric material to expose the mask layer. The method further includes removing the mask layer. After removing the mask layer, a portion of the high-k dielectric liner extends above a top surface of the p-well region. The method further includes forming an image sensor in the p-well region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
  forming a patterned mask layer over a semiconductor substrate;
  using the patterned mask layer to etch the semiconductor substrate and form an opening extending from a top surface of the semiconductor substrate into the semiconductor substrate, the opening being entirely within a p-well of the semiconductor substrate;
  depositing a high-k dielectric layer on sidewalls and a bottom of the opening, wherein the high-k dielectric layer comprises a metal oxide high-k dielectric material, wherein the metal oxide high-k dielectric material directly contacts the p-well;
  after depositing the high-k dielectric layer, annealing the high-k dielectric layer;
  after annealing the high-k dielectric layer, filling a dielectric material into the opening and on the high-k dielectric layer;
  performing a planarization to remove excess portions of the dielectric material over the top surface of the patterned mask layer;
  removing the patterned mask layer to expose a sidewall of the high-k dielectric layer, wherein the sidewall of the high-k dielectric layer extends continuously from the top surface of the semiconductor substrate to a top surface of the dielectric material above the top surface of the semiconductor substrate after removing the patterned mask layer; and
  after the step of performing the planarization, forming a photo image sensor completely within the p-well of the semiconductor substrate, wherein the photo image sensor is configured to receive light, and convert the light to an electrical signal.

2. The method of claim 1, wherein substantially no portion of the dielectric material contacts the semiconductor substrate.

3. The method of claim 1, wherein removing the patterned mask layer comprises a wet clean process using a solution comprising $H_3PO_4$.

4. The method of claim 1, wherein in a duration between the step of depositing the high-k dielectric layer and performing the planarization, no implantation is performed to implant any p-type impurity into portions of the semiconductor substrate that are underlying, and contacting, the high-k dielectric layer.

5. The method of claim 1, wherein the high-k dielectric layer is selected from the group consisting essentially of $HfO_2$, HFSiOx, HFSiON, $ZrO_2$, $La_2O_3$, and combinations thereof.

6. The method of claim 1, wherein annealing the high-k dielectric layer is performed at a temperature between about 500° C. and about 1000° C.

7. The method of claim 1, wherein removing the patterned mask layer completely removes the patterned mask layer.

8. The method of claim 1, further comprising prior to forming the patterned mask layer, forming a dielectric layer over the semiconductor substrate, wherein the opening extends through the dielectric layer.

9. A method comprising:
  forming a p-well in a semiconductor substrate;
  depositing a mask layer over the semiconductor substrate;
  patterning an opening through the mask layer and extending the opening into the semiconductor substrate, wherein the opening is completely within the P-well;
  depositing a high-k dielectric layer over the mask layer and along sidewalls and a bottom surface of the opening, wherein the high-k dielectric layer comprises a k-value greater than 8.0, the high-k dielectric layer comprising a metal oxide material, sidewalls and a bottom of the high-k dielectric layer contacting the p-well;
  performing a first anneal on the high-k dielectric layer;
  after performing the first anneal, filling remaining portions of the opening with a dielectric material in physical contact with the high-k dielectric layer;

removing excess portions of the high-k dielectric layer and the dielectric material over the mask layer, wherein removing the excess portions of the high-k dielectric layer comprises a planarization process to expose a top surface of the mask layer;

removing the mask layer to expose sidewalls of a portion of the high-k dielectric layer extending above a top surface of the semiconductor substrate; and forming an image sensor in the semiconductor substrate, wherein the p-well completely surrounds the image sensor.

10. The method of claim 9 further comprising:

prior to depositing the mask layer, forming a pad layer on a top surface of the semiconductor substrate, wherein the mask layer is deposited over the pad layer; and after removing excess portions of the high-k dielectric layer, removing the pad layer to expose sidewalls of a portion of the high-k dielectric layer extending over a top surface of the semiconductor substrate.

11. The method of claim 10, wherein forming the pad layer comprises a thermal oxidation process.

12. The method of claim 10, wherein removing the pad layer comprises using diluted hydrofluoric (HF) acid.

13. The method of claim 9 further comprising after filling the remaining portions of the opening with the dielectric material, performing a second anneal on the high-k dielectric layer and the dielectric material.

14. The method of claim 9, wherein the high-k dielectric layer comprises $HfO_2$, HFSiOx, HFSiON, $ZrO_2$, $La_2O_3$, or combinations thereof.

15. The method of claim 9, wherein the first anneal is performed at a temperature between about 500° C. and about 1000° C.

16. A method comprising:

patterning an opening into a p-well region of a semiconductor substrate using a mask layer as a patterning mask;

depositing a high-k dielectric liner on opposing sidewalls and a bottom surface of the opening, wherein the high-k dielectric liner forms an interface with the p-well region along the opposing sidewalls and the bottom surface of the opening, and wherein the high-k dielectric liner has a k-value greater than 8.0, wherein the high-k dielectric liner comprises a metal oxide;

performing a first anneal on the high-k dielectric liner;

after performing the first anneal, filling remaining portions of the opening with a dielectric material;

planarizing the high-k dielectric liner and the dielectric material to expose the mask layer;

removing the mask layer, wherein a portion of the high-k dielectric liner has a top surface above a top surface of the semiconductor substrate and at a same level as a top surface of the dielectric material after removing the mask layer; and forming an image sensor in the p-well region, wherein no lateral boundary of the image sensor extends beyond lateral boundaries of the p-well region.

17. The method of claim 16 further comprising thermal oxidizing a top surface of the semiconductor substrate to form a pad layer, wherein the mask layer is disposed over the pad layer.

18. The method of claim 16, wherein filling remaining portions of the opening comprises a high aspect ratio process (HARP) using ozone ($O_3$), tetraethyl orthosilicate (TEOS), or a combination thereof as process gases.

19. The method of claim 16, wherein the high-k dielectric liner traps negative charges and accumulates positive charges at an interface between the high-k dielectric liner and the p-well region.

20. The method of claim 16, wherein the high-k dielectric liner comprises $HfO_2$, HFSiOx, HFSiON, $ZrO_2$, $La_2O_3$, or combinations thereof.

* * * * *